United States Patent [19]

Cartagena

[11] Patent Number: 5,362,659
[45] Date of Patent: Nov. 8, 1994

[54] METHOD FOR FABRICATING VERTICAL BIPOLAR JUNCTION TRANSISTORS IN SILICON BONDED TO AN INSULATOR

[75] Inventor: Eric N. Cartagena, Chula Vista, Calif.

[73] Assignee: The United States of America as represented by the Secretary of the Navy, Washington, D.C.

[21] Appl. No.: 232,914

[22] Filed: Apr. 25, 1994

[51] Int. Cl.⁵ .......................................... H01L 21/265
[52] U.S. Cl. ..................................... 437/31; 437/21; 437/62; 437/247; 148/DIG. 10; 148/DIG. 12; 148/DIG. 150
[58] Field of Search .................. 437/31, 33, 62, 909, 437/21, 84, 247; 148/DIG. 10, DIG. 11, DIG. 12, DIG. 150

[56] References Cited

U.S. PATENT DOCUMENTS

| | | | |
|---|---|---|---|
| 3,974,560 | 8/1976 | Mueller et al. | 29/590 |
| 4,179,792 | 12/1979 | Marshall et al. | 29/571 |
| 4,659,392 | 4/1987 | Vasudev | 148/1.5 |
| 4,753,895 | 1/1988 | Mayer et al. | 437/21 |
| 4,775,641 | 10/1988 | Duffy et al. | 437/21 |
| 4,851,370 | 7/1989 | Doklan et al. | 437/225 |
| 5,036,021 | 7/1991 | Goto | 437/62 |
| 5,070,030 | 12/1991 | Ikeda et al. | 437/31 |
| 5,073,506 | 12/1991 | Marzara et al. | 437/21 |
| 5,087,580 | 2/1992 | Eklund | 437/31 |

OTHER PUBLICATIONS

Ser. No. 8,074,515 dated Jun. 7, 1993 Imthurn et al. 156/60.

Primary Examiner—Brian E. Hearn
Assistant Examiner—Tuan Nguyen
Attorney, Agent, or Firm—Harvey Fendelman; Thomas Glenn Keough; Michael A. Kagan

[57] ABSTRACT

A method is provided for manufacturing a bipolar transistor, comprising the steps of: 1) abutting a polished surface of a substantially single crystal silicon wafer with a polished surface of an insulating substrate; 2) heating the abutting silicon wafer and insulating substrate at about 200° C. for about 30 minutes to form a bonded wafer having a silicon layer; 3) forming a silicon island from the silicon layer; 4) ion implanting a first dopant species having a first conductivity into the silicon island to form a base region in the silicon island; 5) ion implanting a second dopant species having a second conductivity opposite the first conductivity into the silicon island to form an emitter region and a collector region in the silicon island; 6) ion implanting a third dopant species having the first conductivity into the base region of the silicon island; 7) heating the bonded wafer at a temperature of about 800° C. to activate the first, second, and third dopant species and to repair ion implanting damage to the silicon island; 8) forming electrical contacts to the base, emitter, and collector regions; and 9) forming an oxide layer over the electrical contacts to passivate the electrical contacts.

17 Claims, 8 Drawing Sheets

METHOD FOR FABRICATING VERTICAL BIPOLAR JUNCTION TRANSISTORS IN SILICON BONDED TO AN INSULATOR

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the fabrication of vertical bipolar junction transistors, and more particularly to fabricating vertical bipolar junction transistors in a single crystal silicon wafer bonded to an insulating substrate such as sapphire.

Bipolar junction transistors (BJT's) and diodes have been fabricated in silicon-on-sapphire (SOS) films with varying degrees of success. Most research has been concentrated in the area of lateral BJT's, epitaxial silicon grown BJT's, and heteroepitaxy BJT's. Lateral bipolar devices fabricated in SOS have low cutoff frequencies and are not suitable for driving large amounts of current. Also, due to the low carrier lifetime material, lateral devices historically have had low current gain. Vertical BJT's fabricated in SOS have traditionally suffered from low current and low recombination lifetimes due to the poor quality of crystal structure of the silicon.

U.S. Pat. No. 3,974,560 describes a process for manufacturing planar bipolar transistors which includes ion implanting a collector contact well in a layer of single crystal silicon epitaxially grown on an insulating substrate such as sapphire. Then the silicon layer is annealed for about 15 minutes at a temperature in the range of about 900° C. to 1100° C.

It is well known that epitaxially grown silicon is different from "bulk" silicon. First, silicon deposited epitaxially on sapphire does not exhibit the crystal perfection of a bulk, single-crystal silicon wafer. Further, the region of epitaxially grown silicon nearest the sapphire substrate is not a good semiconductor.

Another difference which distinguishes SOS from bulk single crystal silicon is the relatively higher density of crystal lattice defects found in silicon epitaxially grown on sapphire, manifesting in very low minority carrier lifetimes. Lifetimes in the range of about 0.1–10 nanoseconds are typical for such SOS layers, whereas in bulk silicon, minimum carrier lifetimes are about 10 nanoseconds and carrier lifetimes in general typically range from about 100 nanoseconds to 1 microsecond.

Still another difference between the silicon in a conventional SOS structure and bulk silicon is the uncontrolled nature of the impurity diffusion constant in the SOS structure. Activation energies required to move an atom out of position in the crystal lattice of an SOS structure are generally lower and not as uniform and controlled as they are in bulk silicon. Hence, fast, localized diffusion occurs much more easily in SOS, tending to short out the junction of bipolar device made in SOS. This is especially true for SOS bipolar transistors because the emitter-collector separation distance must be very small and because the carrier lifetime is so short.

Thus, it may be appreciated that the electrical performance of a bipolar transistor fabricated in accordance with the methods of the '560 patent is limited by the characteristic of epitaxially grown silicon.

Silicon and sapphire have vastly different coefficients of thermal expansion. For example, the coefficient of thermal expansion of silicon is $3.6 \times 10^{-6}/°C.$, and that of sapphire is $5.0 \times 10^{-6}/°C$. Because of this difference, SOS structures subjected to large temperature differentials tend to exhibit thermally induced cracks in the vicinity of the silicon and sapphire interface. Such cracks prevent the manufacture of operable devices. Because the SOS structure described in the '560 patent is subject to a relatively high temperature anneal (900–1100° C.), it is particularly vulnerable to thermal cracking.

Thus, it may be appreciated that there is a need for a method for manufacturing bipolar transistors using single crystal, bulk silicon and which does not require high temperature processing. Such a method would produce bipolar transistors having superior performance over bipolar transistors manufactured using conventional methods.

SUMMARY OF THE INVENTION

Figure 1:
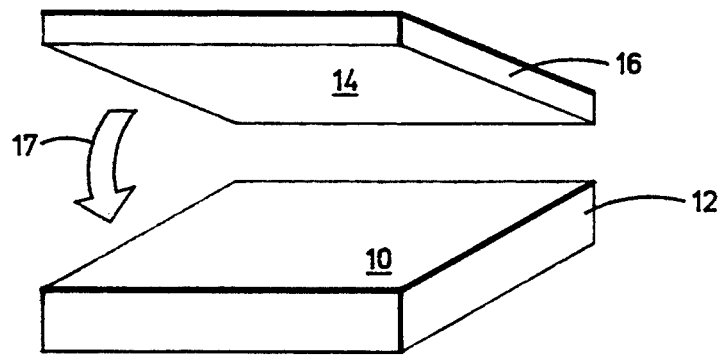
FIGS. 1–18 illustrate various stages in the manufacture of bipolar junction transistors in accordance with methods of the present invention.

A method is provided for manufacturing a bipolar transistor, comprising the steps of: 1) abutting a polished surface of a substantially single crystal silicon wafer with a polished surface of an insulating substrate; 2) heating the abutting silicon wafer and insulating substrate at about 200° C. for about 30 minutes to form a bonded wafer having a silicon layer; 3) forming a silicon island from the silicon layer; 4) ion implanting a first dopant species having a first conductivity into the silicon island to form a base region in the silicon island; 5) ion implanting a second dopant species having a second conductivity opposite the first conductivity into the silicon island to form an emitter region and a collector region in the silicon island; 6) ion implanting a third dopant species having the first conductivity into the base region of the silicon island; 7) heating the bonded wafer at a temperature of about 800° C. to activate the first, second, and third dopant species and to repair ion implanting damage to the silicon island; 8) forming electrical contacts to the base, emitter, and collector regions; and 9) forming an oxide layer over the electrical contacts to passivate the electrical contacts.

Another implementation of the method for manufacturing a bipolar transistor in accordance with the present invention, comprises the steps of: 1) abutting a polished surface of a substantially single crystal silicon wafer with a polished surface of an insulating substrate; 2) heating the abutting silicon wafer and insulating substrate at about 200° C. for about 30 minutes to form a bonded wafer having a silicon layer; 3) forming a silicon island from the silicon layer; 4) ion implanting a first dopant species having a first conductivity into the silicon island to form a base region; 5) heating the bonded wafer at a temperature of about 800° C. to activate first dopant species in the base region and to repair ion implanting damage to the silicon layer; 6) ion implanting a second dopant species having a second conductivity opposite the first conductivity into the silicon island to form an emitter region and a collector region; 7) ion implanting a third dopant species having the first conductivity into the base region of the silicon layer; 8) heating the bonded wafer at a temperature of about 800° C. to activate the second and third dopant species and to repair ion implanting damage to the silicon island; 9) forming electrical contacts to the base, emitter, and collector regions; and 10) forming an oxide layer over the electrical contacts to passivate the electrical contacts.

In yet another implementation of the methods of the present invention, silicon wafer may be ion implanted with a species having a suitable conductivity in the region where the silicon wafer abuts the insulating substrate to provide a buried subcollector region.

In applications where the electrically insulating structure is made of sapphire, the problem of limited carrier lifetime in silicon-on-sapphire structures is solved by bonding a single crystal silicon wafer to the sapphire substrate to form a bonded wafer. The bonded wafer may be etched back to a thickness suitable for bipolar devices, leaving a thin film of single crystal silicon.

DESCRIPTION OF THE PREFERRED EMBODIMENT

In the manufacture of bipolar junction transistors in accordance with the method of the present invention, a single crystal silicon wafer is bonded to an insulating substrate to form a bonded silicon-on-insulator structure or wafer. The material comprising the substrate is preferably sapphire. Referring to FIG. 1, planar surface 10 of sapphire substrate 12 and planar surface 14 of a single crystal bulk silicon wafer 16 are preferably each polished to a generally mirror-like surface. Preferably, the orientation of the sapphire substrate 12 is the (1102) plane, as determined by the X-ray method in accordance with ASTM E82 (Laue Method) or ASTM F26 (Bragg Reflection Method) where upon orthogonal components of misorientation are determined to a accuracy of $\pm/-0.05$ degrees and whose vector sum is not to exceed 2.0 degrees. In the preferred, embodiment, by way of example: the surface flatness of the sapphire substrate 12 should not exceed 10 microns (peak to peak valley deviation); and the maximum bow and warp may be 40 microns. After being polished, the planar surfaces 10 and 14 are then cleaned using an RCA clean or hydrophilization bath. The cleaned sapphire substrate 12 and silicon wafer 16 are rinsed in deionized water and dried with heated nitrogen. The polished surfaces 10 and 14 then are placed in contact with one another, as indicated by the arrow 17, so that the silicon wafer 16 and sapphire substrate 12 abut one another and thereby form an inchoate wafer structure.

Figure 2:
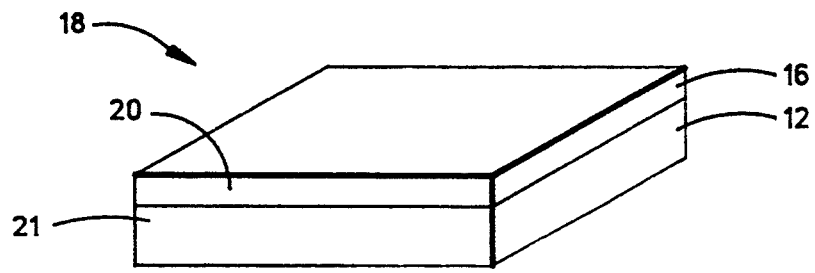

The inchoate wafer structure is placed in a furnace and heated to about 200° C. for approximately 30 minutes, preferably in a nitrogen atmosphere, whereupon the silicon wafer 16 and insulating substrate 12 bond together to form a bonded wafer 18, as shown in FIG. 2. After being bonded to the sapphire substrate 12, the silicon wafer 16 is hereinafter referred to as a silicon layer 20 when referenced with respect to wafer 18. Forming the wafer 18 at such a relatively low temperature greatly minimizes the generation of thermally induced cracks in the silicon layer 20 and sapphire substrate 12. After formation of the wafer 18, the silicon layer 20 may then be chemically etched and ground back to a desired starting thickness, as for example, in the range of 3–5 micrometers.

Figure 3:
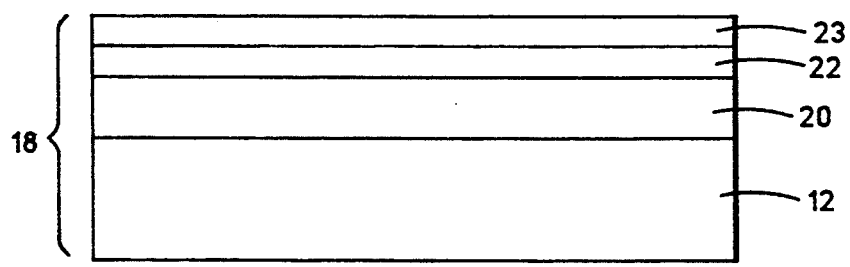
Figure 4:
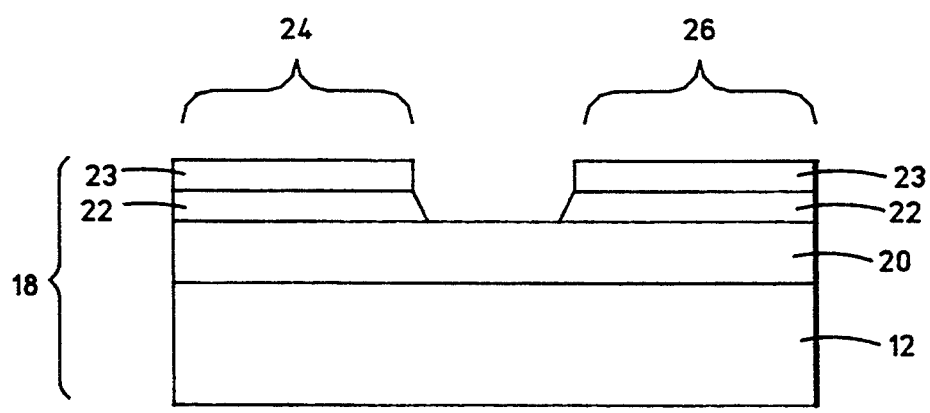
Figure 5:
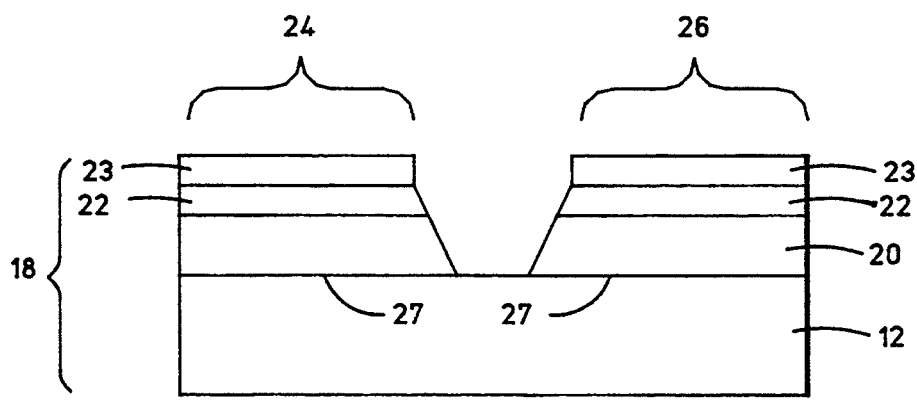
Figure 6:
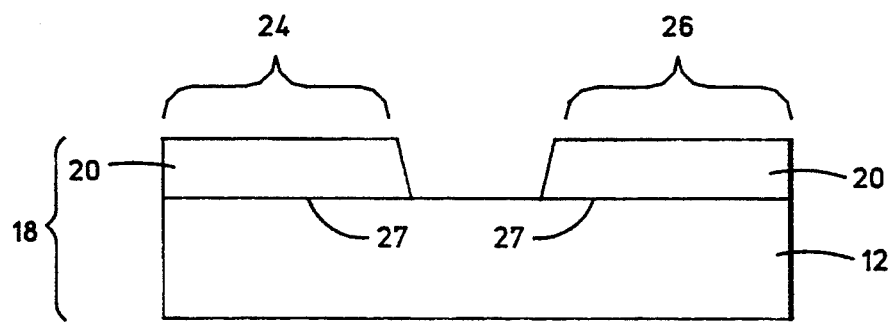

Next, an oxide layer 22 is deposited on the silicon wafer at a very low temperature, preferably in the range of about 200° C., and then a layer of photoresist 23 is formed on the oxide layer 22, as shown in FIG. 3. Referring to FIG. 4, the oxide layer 22 is patterned using standard photolithographic techniques to mask the photoresist 23. Sections of the oxide layer 22 are removed using a buffered oxide etch to expose selected regions of the silicon layer 20. A phosphoric acid etch at a temperature of about 200° C. removes the exposed region of silicon layer 20, thereby defining silicon islands 24 and 26, shown in FIG. 5, which will be transformed in bipolar transistors. Now, referring to FIG. 6, a subsequent photoresist ashing step and another buffered oxide etch remove the leftover photoresist 23 and remainder of oxide layer 22, thereby exposing regions of the silicon layer 20 in the islands 24 and 26 on which bipolar transistors will be fabricated.

Figure 7:
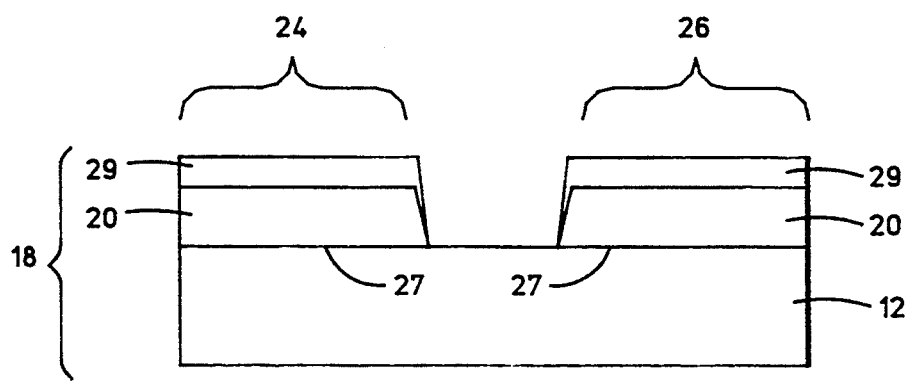
Figure 19:
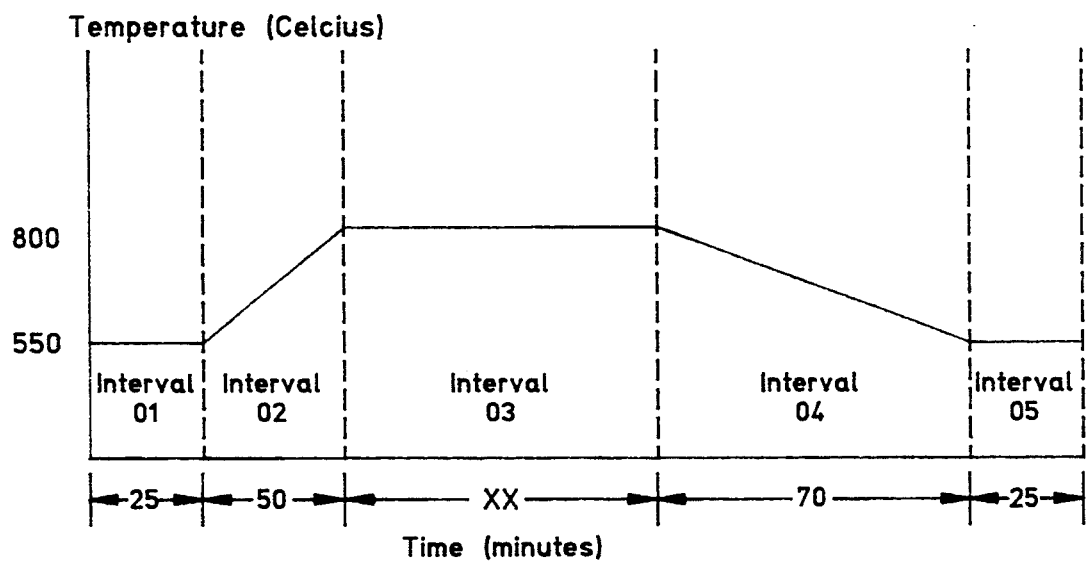
FIG. 19 is a graph of a time vs. temperature function representing the operation of a furnace used to anneal the wafer on which bipolar junction transistors manufactured in accordance with the methods of the present invention are fabricated.

The wafer 18 then is heated in a furnace having a nitrogen atmosphere and which is maintained at a temperature of about 550° C. The furnace temperature is slowly increased, preferably at a rate of about 6° C./min, up to a final temperature of about 800° C. Such heating helps to seal the bond between the silicon layer 20 and sapphire substrate 12 in a manner which minimizes stress in the vicinity of the interface 27 of the sapphire substrate 12 and silicon layer 20. The sapphire/silicon interface 27 of wafer 18 is less susceptible to thermal cracking at these higher (550° C. to 800° C.) temperatures than it was when the silicon wafer 16 and sapphire substrate 12 were bonded because the formation of the silicon islands reduces the geometry of the silicon/sapphire interface 27. While the furnace temperature is maintained at 800° C., hydrogen and oxygen gas are introduced into the furnace to grow an oxide layer 29 having a thickness of about 350 Å over the wafer 18, as shown in FIG. 7. The temperature in the furnace is then decreased slowly, as for example, at 4° C./min, to a final temperature of 550° C. and the wafer 16 then is pulled from the furnace. An example of a suitable time vs. temperature profile for the furnace is shown in FIG. 19.

Figure 8:
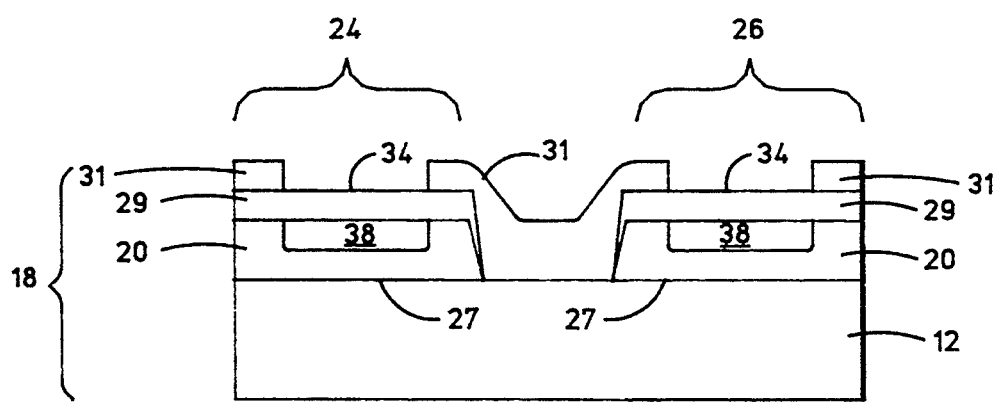
Figure 9:
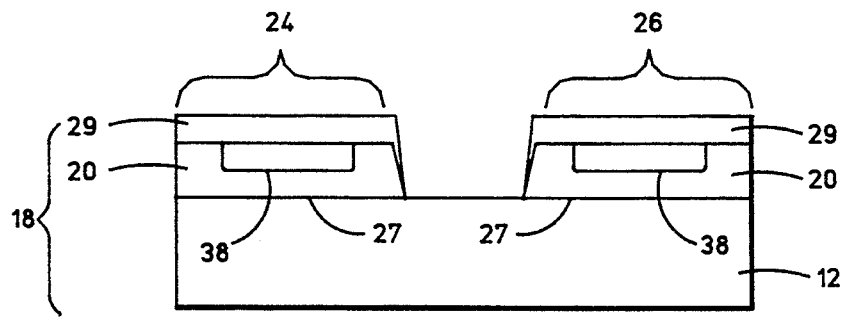

Referring to FIG. 8, a photoresist layer 31 is formed over the wafer 18 and then patterned to expose selected areas 34 of the oxide layer 29. Next, selected regions of silicon islands 24 and 26 are ion implanted through the oxide layer 29 with a dopant species having an appropriate conductivity (i.e., n- or p-type dopant) to form ion implanted regions 38 in the silicon layer 20 beneath the areas 34. The dopant species and concentration determine, in part, electrical characteristics such as current gain, unity gain bandwidth, resistance, and capacitance of the resulting bipolar transistors. By way of example, in the manufacture of an PNP type transistor, an n-type dopant species, such as phosphorus or arsenic, may be ion implanted at a dosage concentration in the range of about $10^{12}/cm^2$ to $10^{13}/cm^2$ and at an energy level of about 150 KeV into the silicon layer 20 to create the ion implanted base regions 38. Then the layer of photoresist 31 is removed by a plasma etch process so wafer 18 has the structure shown in FIG. 9. At this stage, the implanted dopant species in base regions 38 are inactive.

The wafer 18 preferably next is placed in a furnace having an inert atmosphere, such as nitrogen, which is maintained at 550° C. to repair damage done to the base regions 38 and to activate the implanted dopant species, where "repair" refers to recrystallization of the silicon layer 20. The temperature of the furnace is slowly increased, preferably at a rate of about 6 ° C./min, up to a final temperature of about 800° C. The period at which the wafer 18 is soaked at 800° C. is variable, depending upon the desired electrical properties of the transistor. For example, increasing the heat soak period results in increased gain, but also increases the probability of emitter and collector shorts. Then, the furnace temperature is slowly decreased, preferably at a rate of about 4° C./min, to a final temperature of 550° C. The wafer 18 may then be removed from the furnace. It is to be understood however, that the scope of the methods of the present invention include deferring such heating, or annealing until after all ion implanting steps have been completed, as described more fully further herein.

Figure 10:
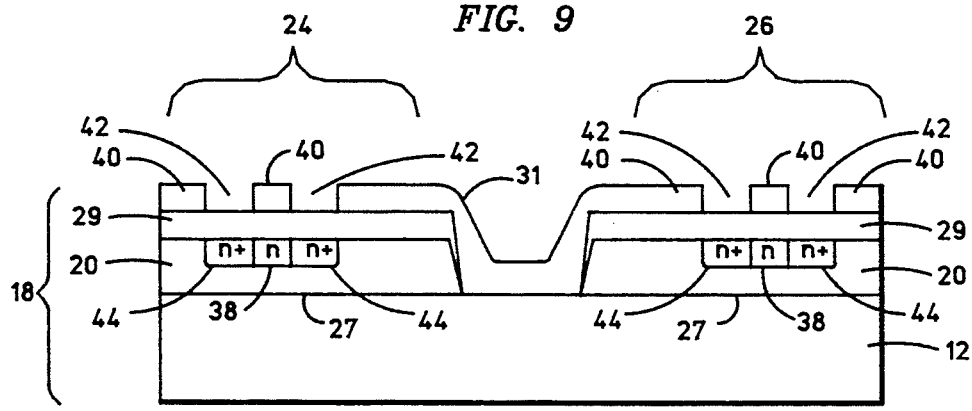
Figure 11:
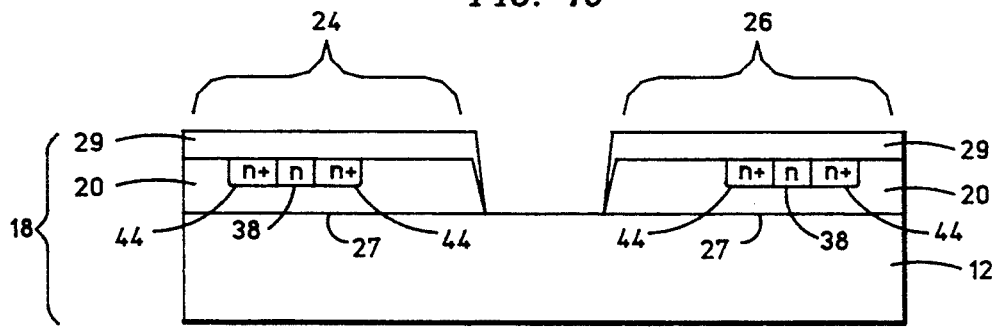

Referring now to FIG. 10, a layer of photoresist 40 formed over the wafer 18 is patterned to provide extrinsic base regions 42 which expose selected areas of the oxide layer 29. The extrinsic base regions 42 are used to define electrical contact regions at the base regions 44 of the bipolar transistors being fabricated. Desired dopant species at appropriate dosage concentrations and energy levels then are implanted through the vias 42 and the oxide layer 29 into the base regions 38. For example, in the manufacture of PNP bipolar transistors, as illustrated in FIG. 10, if the ion implanted regions 38 are implanted with an n-type dopant, an appropriate n-type dopant species implanted through the vias 42, such as arsenic, may be implanted at a dosage concentration of about $10^{15}/cm^2$ having an energy level of about 100 KeV to create n+ regions 44 in the base regions 38. The layer of photoresist 40 then is removed by a plasma etch process leaving the structure shown in FIG. 11.

Figure 12:
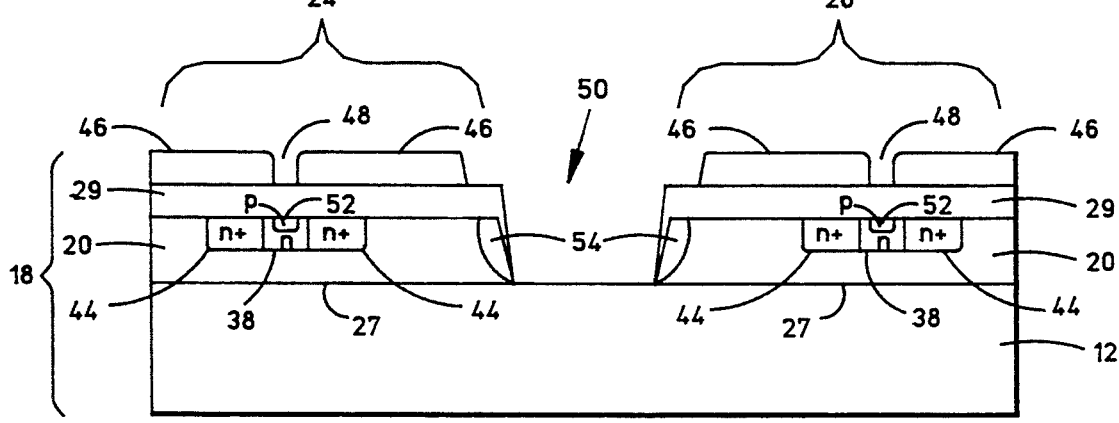
Figure 13:
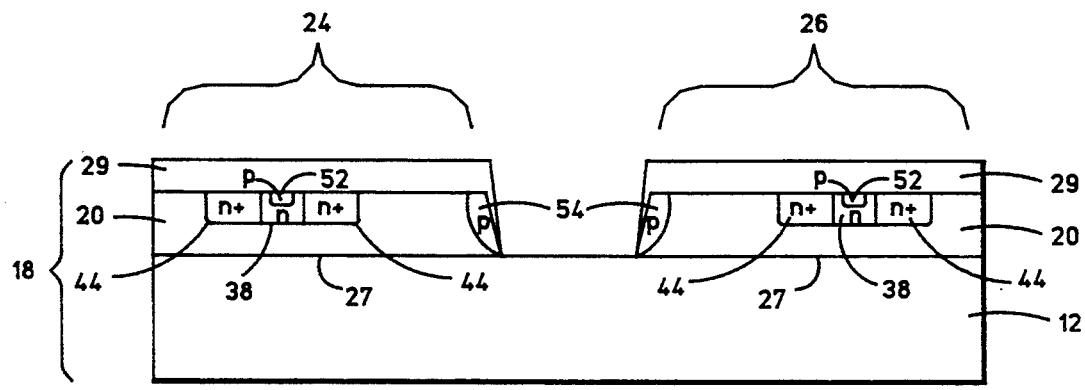

Referring next to FIG. 12, a photoresist layer 46 formed over the wafer 18 is patterned to provide vias 48 and 50 which are used to define the emitter and collector regions of the as yet to be completed bipolar transistors. Next, a desired dopant species having appropriate conductivity is ion implanted through vias 48 into regions 38 to form p-type or emitter regions 52, and through via 50 into silicon layer 20 to create p-type collector region 54. By way of example, in the manufacture of an PNP bipolar transistor, such dopant species may be boron, having a p-type conductivity, which is ion implanted at a concentration of $10^{15}/cm^2$ and at an energy level of about 50 KeV to create p-type regions 52. The photoresist layer 46 then is removed using a plasma etch, leaving the wafer 18 with the structure shown in FIG. 13.

Figure 14:
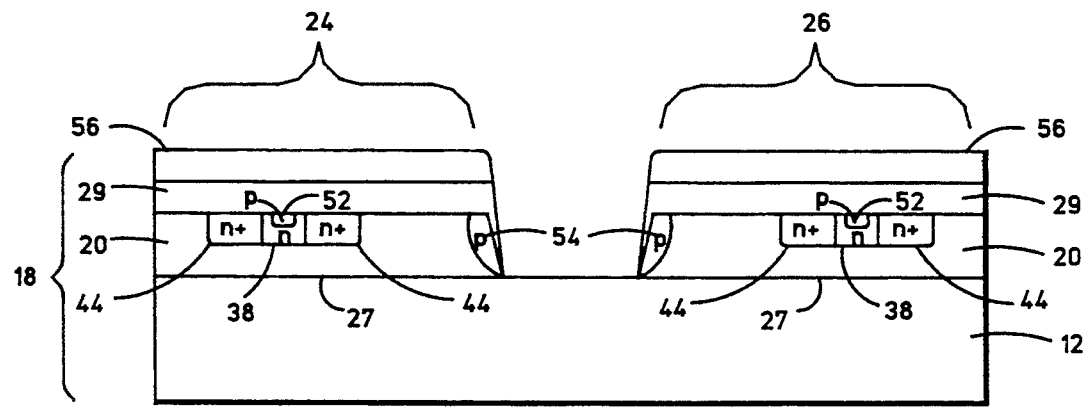

FIG. 14 illustrates an oxide layer 56, preferably having a thickness of about 5000 Å, deposited over the wafer 18 using standard low pressure chemical vapor deposition techniques. In general, the oxide layer 56 is deposited at a temperature which does not exceed about 200° C. The oxide layer 56 prevents surface inversion of the silicon layer 20 which would cause undesirable capacitive coupling between later fabricated collector and emitter regions. The wafer 18 then is preferably heat soaked in a furnace having a nitrogen atmosphere in order to repair implanting damage in n+ regions 44 and collector regions 54, and to activate the implanted dopant species in such regions. The furnace is operated so as to have a temperature vs. time profile such as that shown in FIG. 19. This latter heating step may also repair implanting damage done to the base regions 38 and to activate the implanted dopant species in such base regions if the base regions 38 had not previously been subjected to an anneal.

Figure 15:
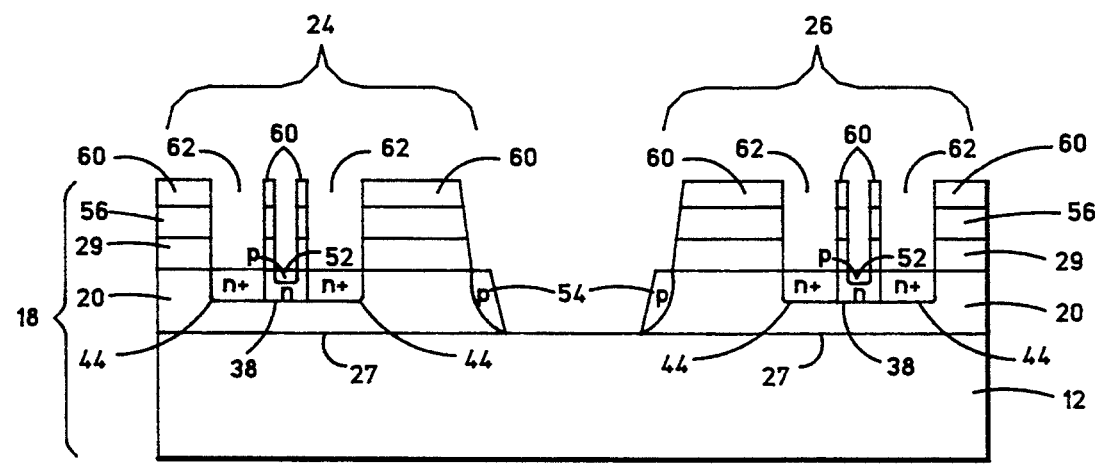
Figure 16:
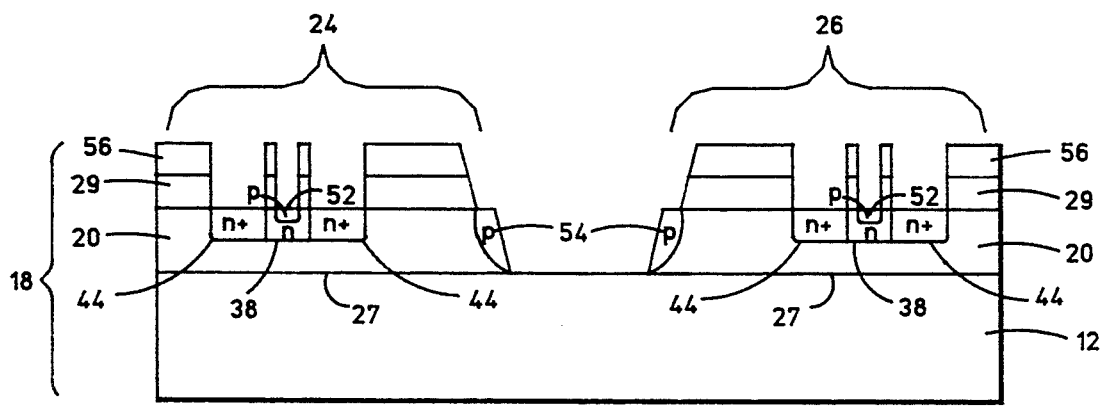

In FIG. 15, a photoresist layer 60 is shown formed over the oxide layer 56 and patterned whereupon oxide layers 56 and 29 are subjected to a buffered oxide etch to create vias 62 so that ohmic contacts may later be made to the base regions 44 and to collector regions 54. The photoresist layer 60 then is removed using a plasma etch process, leaving the wafer 18 with the structure shown in FIG. 16.

Figure 17:
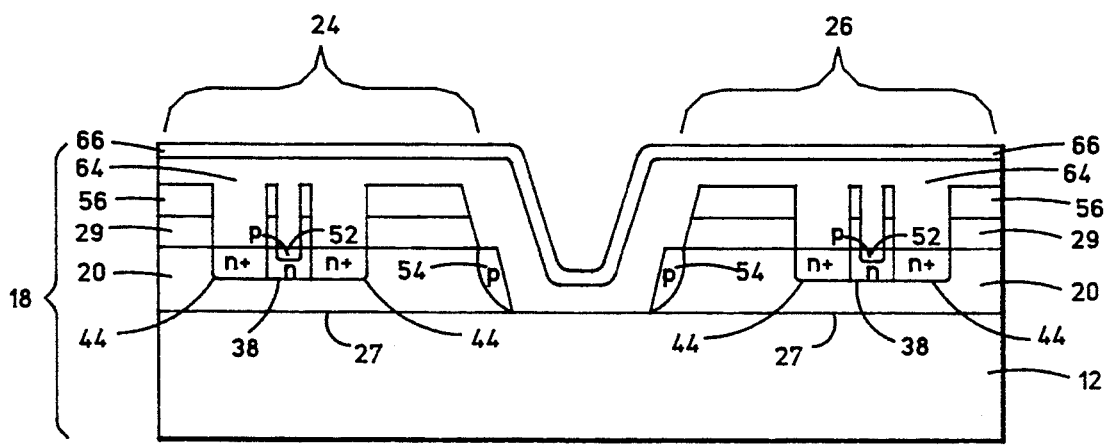

Referring now to FIG. 17, an electrically conductive layer 64 is deposited over the wafer 18. By way of example, the conductive layer 64 may have a thickness on the order of about 10000 Å and consist, for example, of an aluminum/1% silicon composition, or polysilicon. A layer of photoresist 66 formed over the conductive layer 64 is patterned and etched to transform the conductive layer 64 into distinct, generally ohmic contacts $64_b$, $64_e$, and $64_c$ to the base, emitter, and collector regions 44, 52, and 54, respectively, of the transistors being formed from the islands 24 and 26. The patterned photoresist layer 66 is removed using a plasma etch after the conductive layer 64 is patterned.

For applications in which the conductive layer 64 is composed primarily of aluminum, the wafer 18 should preferably also be heated, or annealed at 400° C. for about 60 minutes to sinter the aluminum to provide good ohmic contact to the silicon layer 20.

For applications in which the conductive layer 64 is made of polysilicon, the conductive layer 64 is subjected to a series of masking and ion implanting steps, in accordance with well known photolithographic techniques, so that different regions of the polysilicon are ion implanted with dopant species having conductivity corresponding to the underlying base regions 44, emitter regions 52, and collector regions 54. Then, the wafer 18 is heated so that the species implanted into the polysilicon diffuses into the base, collector, and emitter regions of the silicon layer 20.

Figure 18:
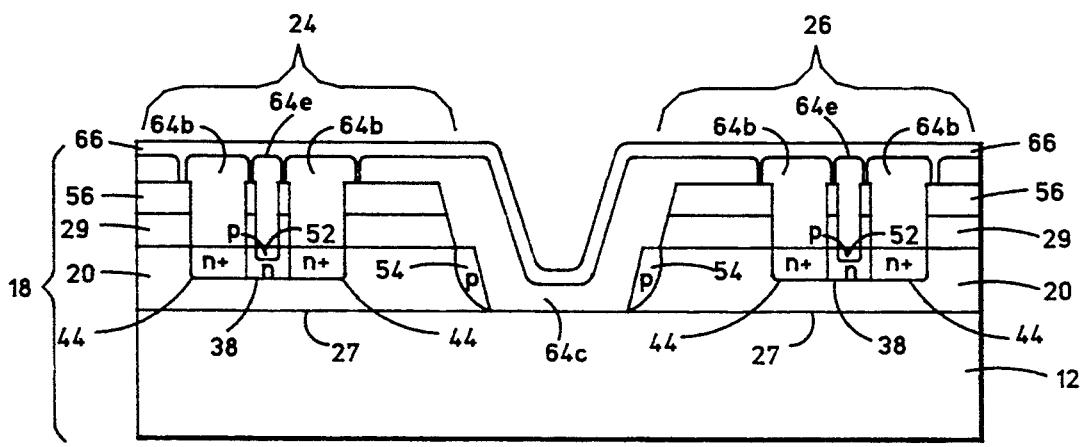

As a final step, an oxide layer 68 preferably is formed over the wafer 18 to passivate the ohmic contacts $64_b$, $64_c$, and $64_e$, thereby completing the manufacture of vertical bipolar transistors, shown in cross-section in FIG. 18.

Figure 20:
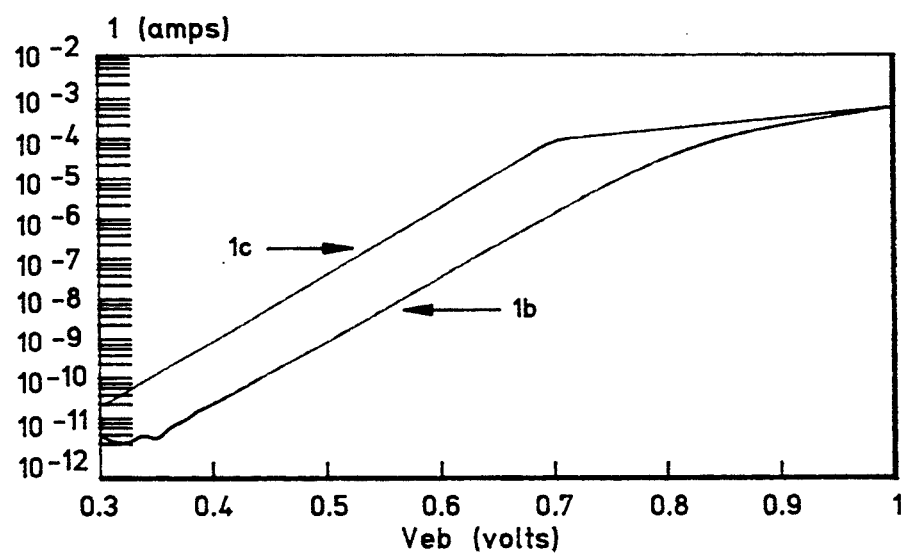
FIG. 20 illustrates a characteristic Gummel plot of a PNP transistor manufactured in accordance with the methods of the present invention.
Figure 21:
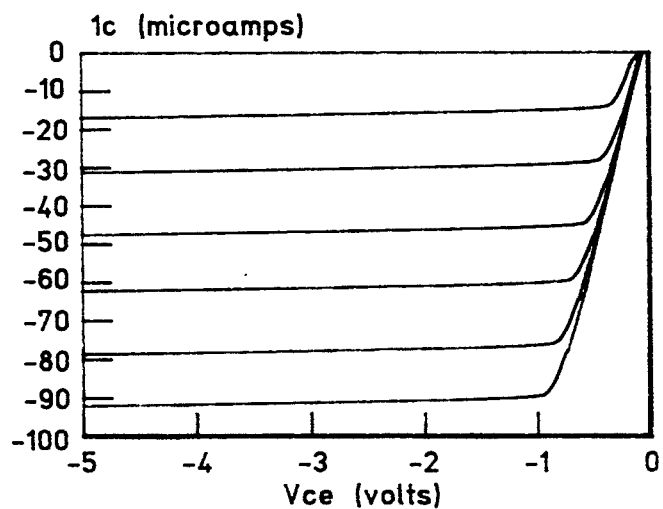
FIG. 21 illustrates characteristic emitter curves for a PNP transistor manufactured in accordance with the methods of the present invention.

Electrical characteristics of an example of a PNP bipolar junction transistor manufactured in accordance with the method of the present invention are presented in FIGS. 20 and 21.

Figure 22:
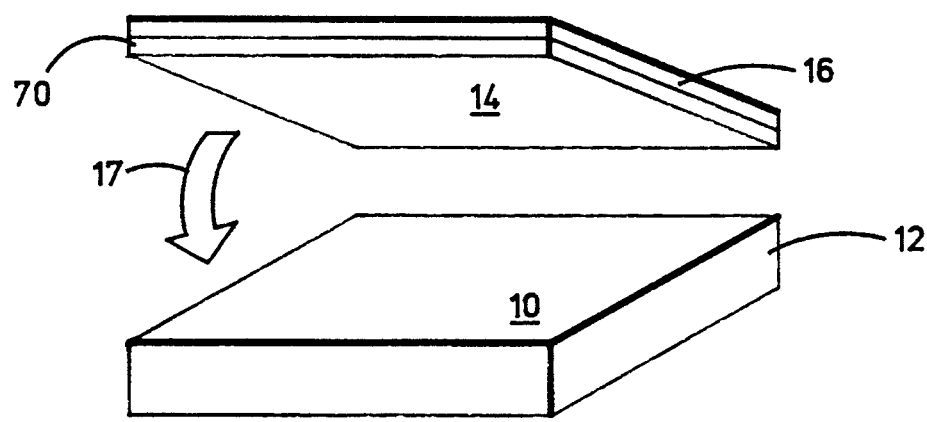
FIGS. 22 and 23 show steps in the bonding of a silicon wafer having a buried subcollector region to an insulating substrate.
Figure 23:
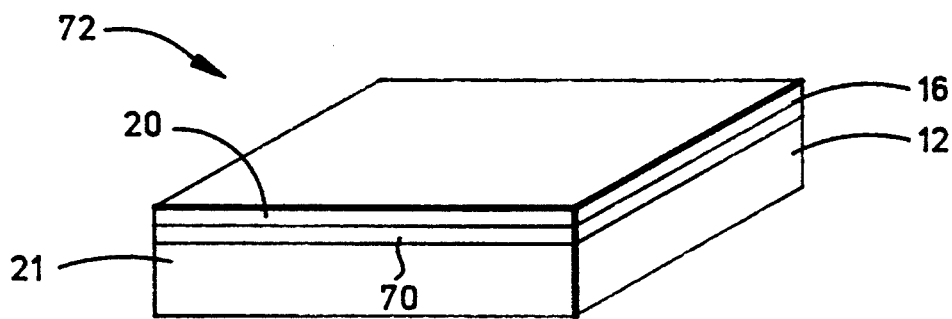
Figure 24:
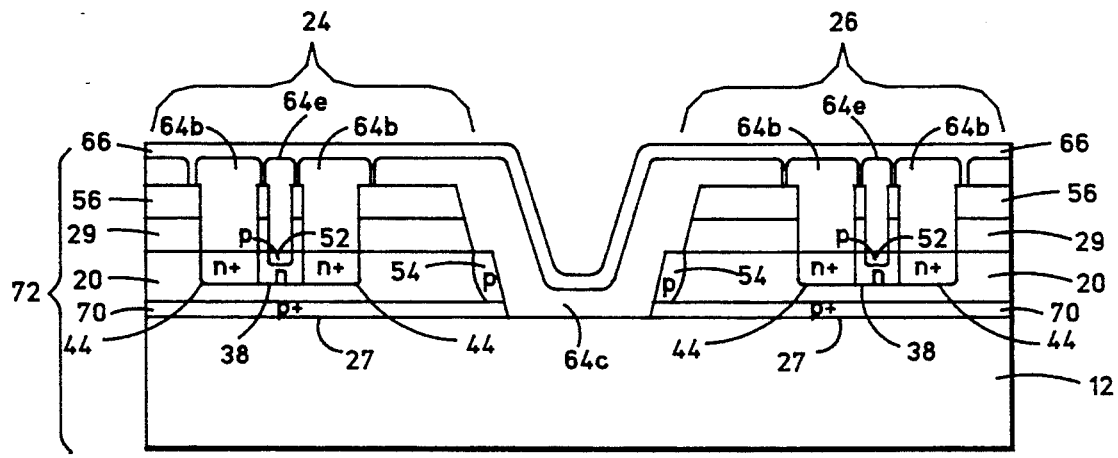
FIG. 24 is a cross-sectional view of a PNP bipolar transistor manufactured in accordance with the methods of the present invention which further includes a buried subcollector region.

In a variation of the methods presented above, described with reference to FIG. 22, the surface 14 of silicon wafer 16 may be heavily ion implanted with a p-type dopant species to create a buried p+ subcollector region 70. Then the surface 14 is polished, as for example to Semiconductor Equipment and Materials International Standard SEMI M1-89. The polished planar surfaces 10 and 14 are then cleaned using an RCA clean or hydrophilization bath. The cleaned sapphire substrate 12 and silicon wafer 16 are rinsed in deionized water and dried with heated nitrogen. The polished surfaces 10 and 14 then are placed in contact with one another, as indicated by the arrow 17, so that the silicon wafer 16 and sapphire substrate 12 abut one another. The abutting silicon wafer 16 and sapphire substrate 12 are placed in a furnace and heated to about 200° C. for approximately 30 minutes, preferably in a nitrogen atmosphere, whereupon they bond together to form a bonded SOS wafer 72, as shown in FIG. 23. The wafer 72 then may be processed in accordance with the methods described above so as to result in the manufacture of bipolar transistors having the structure shown in FIG. 24. An advantage of the p+ buried subcollector region is to reduce series resistance between the intrinsic base regions 38 and the external collector contact 64$_c$.

Figure 25:
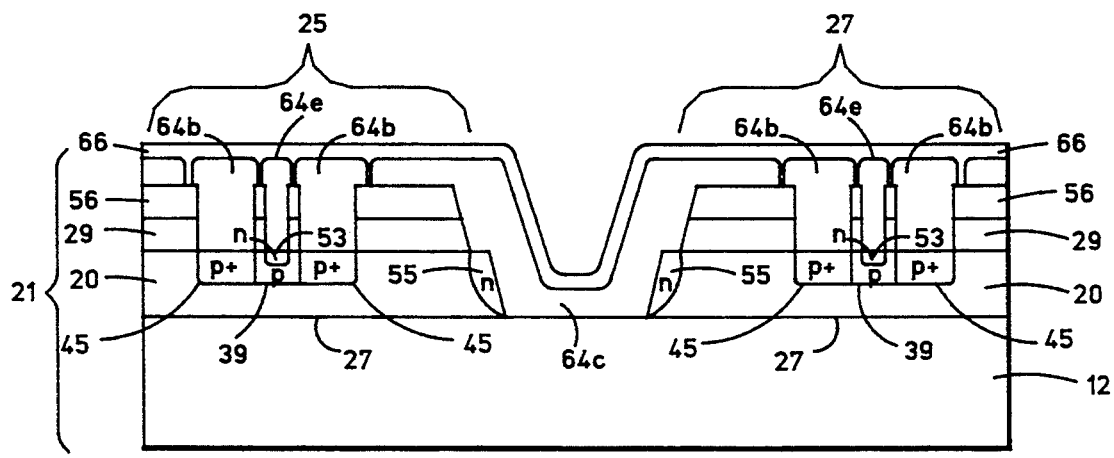
FIG. 25 is a cross-sectional view of an NPN bipolar transistor manufactured in accordance with the methods of the present.

It is to be understood that with appropriate starting material and implants at the intrinsic base, extrinsic base and emitter/collector mask level, NPN bipolar transistors could be readily fabricated in accordance with the methods of the present invention. For example, FIG. 25 illustrates bipolar transistors 25 and 27 formed on wafer 21. The transistors 25 and 27 each include a p-type base region 39, p+ regions 45, an n-type emitter region 53, and a p-type collector region 55.

Obviously, many modifications and variations of the present invention are possible in light of the above teachings. It is therefore to be understood that within the scope of the appended claims, the invention may be practiced otherwise than as specifically described.

I claim:

1. A method for manufacturing a bipolar transistor, comprising the steps of:
  1) abutting a polished surface of a substantially single crystal silicon wafer with a polished surface of an insulating substrate;
  2) heating said abutting silicon wafer and insulating substrate at about 200° C. for about 30 minutes to form a bonded wafer having a silicon layer;
  3) forming a silicon island from said silicon layer;
  4) ion implanting a first dopant species having a first conductivity into said silicon island to form a base region in said silicon island;
  5) ion implanting a second dopant species having a second conductivity opposite said first conductivity into said silicon island to form an emitter region and a collector region in said silicon island;
  6) ion implanting a third dopant species having said first conductivity into said base region of said silicon island;
  7) heating said bonded wafer at a temperature of about 800° C. to activate said first, second, and third dopant species and to repair ion implanting damage to said silicon island;
  8) forming electrical contacts to said base, emitter, and collector regions; and
  9) forming an oxide layer over said electrical contacts to passivate said electrical contacts.

2. The method of claim 1 wherein said insulating substrate is sapphire.

3. The method of claim 2 wherein said first and third dopant species have a negative conductivity, and said second dopant species has a positive conductivity.

4. The method of claim 3 wherein said electrical contact includes aluminum.

5. The method of claim 3 wherein said electrical contact includes polysilicon.

6. The method of claim 2 wherein said first and third dopant species have a positive conductivity, and said second dopant species has a negative conductivity.

7. The method of claim 6 wherein said electrical contact includes aluminum.

8. The method of claim 6 wherein said electrical contact includes polysilicon.

9. A method for manufacturing a bipolar transistor, comprising the steps of:
  1) abutting a polished surface of a substantially single crystal silicon wafer with a polished surface of an insulating substrate;
  2) heating said abutting silicon wafer and insulating substrate at about 200° C. for about 30 minutes to form a bonded wafer having a silicon layer;
  3) forming a silicon island from said silicon layer;
  4) ion implanting a first dopant species having a first conductivity into said silicon island to form a base region;
  5) heating said bonded wafer at a temperature of about 800° C. to activate first dopant species in said base region and to repair ion implanting damage to said silicon layer;
  6) ion implanting a second dopant species having a second conductivity opposite said first conductivity into said silicon island to form an emitter region and a collector region;
  7) ion implanting a third dopant species having said first conductivity into said base region of said silicon layer;
  8) heating said bonded wafer at a temperature of about 800° C. to activate said second and third dopant species and to repair ion implanting damage to said silicon island;
  9) forming electrical contacts to said base, emitter, and collector regions; and
  10) forming an oxide layer over said electrical contacts to passivate said electrical contacts.

10. The method of claim 9 wherein said insulating substrate is sapphire.

11. The method of claim 10 wherein said first and third dopant species have a negative conductivity, and said second dopant species has a positive conductivity.

12. The method of claim 11 wherein said electrical contact includes aluminum.

13. The method of claim 11 wherein said electrical contact includes polysilicon.

14. The method of claim 10 wherein said first and third dopant species have a positive conductivity, and said second dopant species has a negative conductivity.

15. The method of claim 14 wherein said electrical contact includes aluminum.

16. The method of claim 14 wherein said electrical contact includes polysilicon.

17. A method for manufacturing a bipolar transistor, comprising the steps of:
  1) polishing a planar surface of a sapphire substrate;

2) implanting a planar surface of a wafer of substantially single crystal silicon with a first dopant species having a first conductivity;

3) polishing said implanted planar surface of said wafer of substantially single crystal silicon;

4) abutting said polished planar surfaces of said sapphire substrate and wafer to form an inchoate wafer structure;

5) heating said inchoate wafer structure at about 200° C. for about 30 minutes to form a bonded wafer having a silicon layer;

6) forming a silicon island from said silicon layer;

7) ion implanting a second dopant species having a second conductivity opposite said first conductivity into said silicon island to form a base region in said silicon island;

8) ion implanting a third dopant species having a first conductivity into said silicon island to form an emitter region and a collector region in said silicon island;

9) ion implanting a fourth dopant species having said second conductivity into said base region of said silicon island;

10) heating said bonded wafer at a temperature of about 800° C. to activate said first, second, third and fourth dopant species and to repair ion implanting damage to said silicon island;

11) forming electrical contacts to said base, emitter, and collector regions; and 12) forming an oxide layer over said electrical contacts to passivate said electrical contacts.

* * * * *